(12) United States Patent
Park et al.

(10) Patent No.: US 12,336,087 B2
(45) Date of Patent: Jun. 17, 2025

(54) ELECTRONIC DEVICE COMPRISING PRINTED CIRCUIT BOARD

(71) Applicant: SAMSUNG ELECTRONICS CO., LTD., Suwon-si (KR)

(72) Inventors: Haekeu Park, Suwon-si (KR); Hyeonyeong Jeong, Suwon-si (KR); Sunghoon Cho, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 179 days.

(21) Appl. No.: 17/871,266

(22) Filed: Jul. 22, 2022

(65) Prior Publication Data

US 2022/0361319 A1    Nov. 10, 2022

Related U.S. Application Data

(63) Continuation of application No. PCT/KR2021/000683, filed on Jan. 18, 2021.

(30) Foreign Application Priority Data

Feb. 5, 2020    (KR) .................. 10-2020-0013976

(51) Int. Cl.
*H05K 1/02*    (2006.01)
*H04R 1/08*    (2006.01)
(Continued)

(52) U.S. Cl.
CPC ............. *H05K 1/0218* (2013.01); *H04R 1/08* (2013.01); *H04R 1/1016* (2013.01);
(Continued)

(58) Field of Classification Search
None
See application file for complete search history.

(56) References Cited

U.S. PATENT DOCUMENTS

2008/0113695 A1    5/2008    Jung et al.
2019/0260111 A1    8/2019    Muthuswamy et al.
(Continued)

FOREIGN PATENT DOCUMENTS

CA    2747010 C    6/2015
CN    202444609 U *    9/2012
(Continued)

OTHER PUBLICATIONS

International Search Report and Written Opinion for International Application No. PCT/KR2021/000683; International Filing Date Jan. 18, 2021; Date of Mailing Apr. 29, 2021; 9 Pages.
(Continued)

*Primary Examiner* — Walter F Briney, III
(74) *Attorney, Agent, or Firm* — CANTOR COLBURN LLP

(57) ABSTRACT

An electronic device includes a microphone module and a printed circuit board on which the microphone module is disposed. The printed circuit board includes a first layer having at least one first microphone pad coupled to the microphone module, a first ground spaced apart from the first microphone pad, and a second microphone pad coupled to the microphone module and connected to the first ground; and a second layer disposed under the first layer and having a second ground opposite to the first microphone pad and at least a part of the first ground.

12 Claims, 10 Drawing Sheets

(51) Int. Cl.
*H04R 1/10* (2006.01)
*H04R 3/00* (2006.01)

(52) U.S. Cl.
CPC ......... *H04R 1/1041* (2013.01); *H04R 1/1075* (2013.01); *H04R 3/00* (2013.01); *H04R 2420/07* (2013.01); *H05K 2201/10098* (2013.01)

(56) References Cited

U.S. PATENT DOCUMENTS

2021/0083359 A1* 3/2021 Jumani .................... H04R 3/00
2021/0410340 A1* 12/2021 Meeusen ................ H05K 1/111

FOREIGN PATENT DOCUMENTS

| KR | 20070029621 A | 3/2007 |
| KR | 101437505 B1 | 9/2014 |
| KR | 101561912 B1 | 10/2015 |
| KR | 101688142 B1 | 12/2016 |
| WO | 2018128577 A2 | 7/2018 |

OTHER PUBLICATIONS

European Search Report for the corresponding European Application No. 21751419, Date of Mailing: Aug. 17, 2023; 114 pages.
Korean Office Action for KR Application No. 10-2020-0013976 mailed on Apr. 11, 2025.

* cited by examiner

ELECTRONIC DEVICE COMPRISING PRINTED CIRCUIT BOARD

CROSS-REFERENCE TO RELATED APPLICATIONS

This application is a continuation of International Application No. PCT/KR2021/000683, designating the United States, filed on Jan. 18, 2021, in the Korean Intellectual Property Receiving Office and claiming priority to Korean Patent Application No. 10-2020-0013976, filed on Feb. 5, 2020, in the Korean Intellectual Property Office, the disclosures of which are incorporated by reference herein in their entireties.

TECHNICAL FIELD

Various embodiments of the disclosure relate to an electronic device including a printed circuit board.

BACKGROUND ART

With the development of electronic technologies, various types of electronic devices are being developed and distributed. For example, the distribution of portable electronic devices such as smart phones, notebook PCs, tablet PCs, and wearable devices is being expanded. With the expansion of the distribution of electronic devices, miniaturization and mounting of various functions are required for electronic devices. In order to meet to these requirements, various electronic components are mounted on a printed circuit board (PCB).

At least one sound effect-related component may be mounted on a printed circuit board of an electronic device. The sound effect-related components may include, for example, speakers and microphones, and these components may be mounted within a housing of an electronic device in various shapes and arrangements corresponding to the interior or exterior design(s) of the electronic device that is designed in various ways.

An electronic device mounted with a speaker and a microphone may be, for example, a wearable electronic device, such as an in-ear earphone (or an ear set, a headphone, or a headset) or a hearing aid. The wearable electronic device may be worn in or near a user's ear and may be manufactured in a compact size for this purpose.

DETAILED DESCRIPTION OF THE INVENTION

Technical Problem

Various sound components and electronic components may be disposed on a printed circuit board of a wearable electronic device. In a conventional wearable electronic device, an antenna pattern is disposed near a sound component (e.g., a microphone) in order to provide a compact product. However, a sound component disposed in a region where no ground is provided is vulnerable to radio frequency noise caused by the antenna pattern.

Technical Solution

According to various embodiments of the disclosure, it is possible to configure a printed circuit board in a structure that is capable of blocking radio frequency noise introduced into a microphone.

According to various embodiments of the disclosure, it is possible to miniaturize an electronic device and configure the electronic device in a structure that is capable of minimizing radio frequency loss even when an antenna is located adjacent to a microphone.

However, the problems to be solved in the disclosure are not limited to the above-mentioned problems, and may be variously expanded without departing from the spirit and scope of the disclosure.

According to various embodiments of the disclosure, an electronic device may include a microphone module, and a printed circuit board on which the microphone module is disposed. The printed circuit board may include a first layer including at least one first microphone pad coupled to the microphone module, a first ground spaced apart from the first microphone pad, and a second microphone pad coupled to the microphone module and connected to the first ground, and a second layer disposed under the first layer and including a second ground facing at least a portion of the first ground and the first microphone pad.

An electronic device according to various embodiments of the disclosure may include a microphone module and a printed circuit board on which the microphone module is disposed, wherein the printed circuit board may include a ground, at least one first microphone pad spaced apart from the ground, and a second microphone pad connected to the ground, and the ground may surround at least a portion of the first microphone pad.

A printed circuit board according to various embodiments of the disclosure may include a first layer including at least one first microphone pad, a first ground spaced apart from the first microphone pad, and a second microphone pad connected to the first ground, and a second layer disposed under the first layer and including a second ground facing at least a portion of the first ground and the first microphone pad.

Advantageous Effects

The electronic device according to various embodiments of the disclosure is configured in a structure that blocks radio frequency noise affecting a microphone pad. Therefore, it is possible to improve microphone performance.

The printed circuit board according to various embodiments of the disclosure is capable of blocking radio frequency waves flowing into a microphone and reducing antenna radiation loss by using a ground wire.

The electronic device according to various embodiments of the disclosure makes it possible to improve space efficiency since an antenna structure and a microphone are disposed adjacent to each other.

BRIEF DESCRIPTION OF DRAWINGS

The above and other advantages and features of this disclosure will become more apparent by describing in further detail embodiments thereof with reference to the accompanying drawings, in which.

MODE FOR CARRYING OUT THE INVENTION

Figure 1:
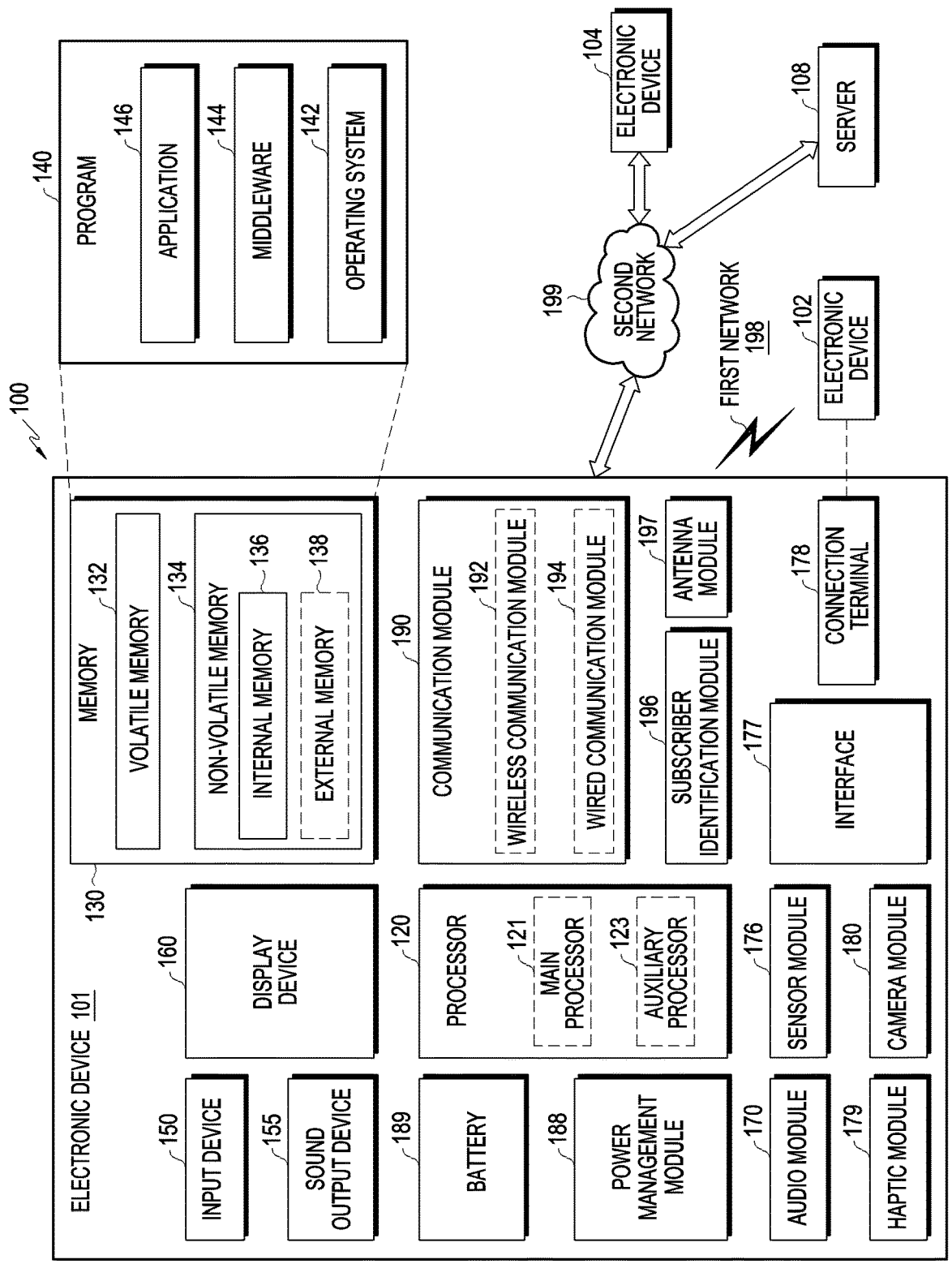
FIG. 1 is a block diagram of an electronic device according to various embodiments of the disclosure in a network environment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "first component," "first region," "first layer," or "first section" discussed below could be termed a second element, component, region, layer, or section without departing from the teachings herein.

The terminology used herein is for the purpose of describing particular embodiments only and is not intended to be limiting. As used herein, "a," "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About," "approximately," and "substantially" as used herein are inclusive of the stated value and means within an acceptable range of deviation for the particular value as determined by one of ordinary skill in the art, considering the measurement in question and the error associated with measurement of the particular quantity (i.e., the limitations of the measurement system). For example, these terms can mean within one or more standard deviations, or within ±30%, 20%, 10%, or 5% of the stated value, or when not associated with a value are within the standard understanding and limits of the particular application and feature.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by a component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image and moving images. According to an embodiment, the camera module 180 may include one or more lenses, image sensors, image signal processors, or flashes.

The power management module 188 may manage power supplied to the electronic device 101. According to one embodiment, the power management module 388 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and support a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
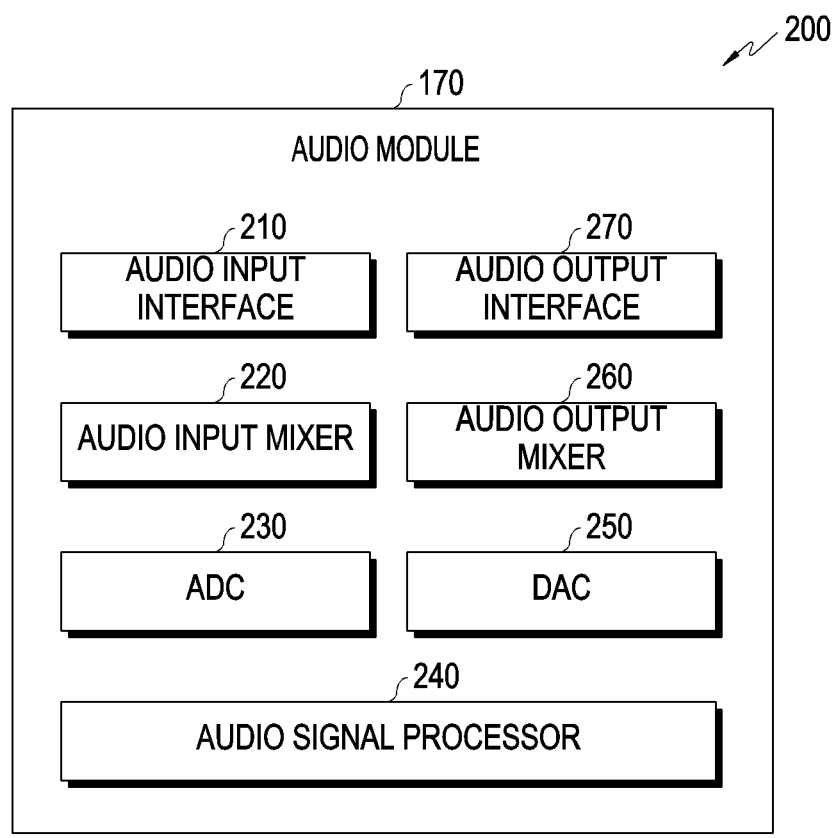
FIG. 2 is a block diagram of an audio module according to various embodiments of the disclosure.

FIG. 2 is a block diagram illustrating an audio module 170 of an electronic device 200 according to various embodiments of the disclosure. Referring to FIG. 2, the audio module 170 may include, for example, at least one of an audio input interface 210, an audio input mixer 220, an analog-to-digital converter (ADC) 230, an audio signal processor 240, a digital-to-analog converter (DAC) 250, an audio output mixer 260, and/or an audio output interface 270. In accordance with some embodiments, all or some of the elements of the audio module 170 and the electronic device 200 of FIG. 2 may be identical to the elements of the audio module 170 and the electronic device 101 of FIG. 1.

The audio input interface 210 may receive an audio signal corresponding to a sound obtained from the outside of the electronic device 200 via a microphone (e.g., a dynamic microphone, a condenser microphone, a piezo microphone, or other microphone as appreciated by those of skill in the art) that is configured as part of an input device of the electronic device 200 (e.g., input device 150 of FIG. 1) or separately from the electronic device 200. For example, if an audio signal is obtained from an external electronic device (e.g., the external electronic device 102 of FIG. 1) (e.g., a headset or a microphone), the audio input interface 210 may be connected with the external electronic device directly via a connecting terminal (e.g., connecting terminal 178 of FIG. 1), or wirelessly (e.g., Bluetooth™ communication) via a wireless communication module (e.g., wireless communication module 192 of FIG. 1) to receive the audio signal. According to an embodiment, the audio input interface 210 may receive a control signal (e.g., a volume adjustment signal received via an input button) related to the audio signal obtained from the external electronic device. The audio input interface 210 may include a plurality of audio input channels and may receive a different audio signal via a corresponding one of the plurality of audio input channels, respectively. According to an embodiment, additionally or alternatively, the audio input interface 210 may receive an external audio signal from another component (e.g., the processor 120 or the memory 130 shown in FIG. 1) of the electronic device 200.

The audio input mixer 220 may be configured to synthesize a plurality of inputted external audio signals into at least one audio signal. For example, according to an embodiment, the audio input mixer 220 may synthesize a plurality of external analog audio signals inputted via the audio input interface 210 into at least one analog audio signal.

The ADC 230 may convert an analog audio signal into a digital audio signal. For example, according to an embodiment, the ADC 230 may convert an analog audio signal received via the audio input interface 210 or, additionally or alternatively, an analog audio signal synthesized via the audio input mixer 220, into a digital audio signal.

The audio signal processor 240 may perform various processing on a digital audio signal received via the ADC 230 or a digital audio signal received from another component of the electronic device 200. For example, according to an embodiment, the audio signal processor 240 may perform changing a sampling rate, applying one or more filters, interpolation processing, amplifying or attenuating a whole or partial frequency bandwidth, noise processing (e.g., attenuating noise or echoes), changing channels (e.g., switching between mono and stereo), mixing, or extracting a specified signal for one or more digital audio signals. According to an embodiment, one or more functions of the audio signal processor 240 may be implemented in the form of an equalizer.

The DAC 250 may convert a digital audio signal into an analog audio signal. For example, according to an embodiment, the DAC 250 may convert a digital audio signal processed by the audio signal processor 240 or a digital audio signal obtained from another component (e.g., the processor 120 or the memory 130 shown in FIG. 1) of the electronic device 200 into an analog audio signal.

The audio output mixer 260 may synthesize a plurality of audio signals, which are to be outputted, into at least one audio signal. For example, according to an embodiment, the audio output mixer 260 may synthesize an analog audio signal converted by the DAC 250 and another analog audio signal (e.g., an analog audio signal received via the audio input interface 210) into at least one analog audio signal.

The audio output interface 270 may output an analog audio signal converted by the DAC 250 or, additionally or alternatively, an analog audio signal synthesized by the audio output mixer 260 to the outside of the electronic device 200 via a sound output device (e.g., sound output device 155 of FIG. 1). The sound output device of the electronic device 200 may include, for example, a speaker, such as a dynamic driver or a balanced armature driver, or a receiver. According to an embodiment, the sound output device of the electronic device 200 may include a plurality of speakers. In such a case, the audio output interface 270 may output audio signals having a plurality of different channels (e.g., stereo channels, 5.1 channels, etc.) via at least some of the plurality of speakers. According to an embodiment, the audio output interface 270 may be connected with the external electronic device (e.g., the external electronic device 102) (e.g., a headset or a microphone) directly via the connecting terminal (e.g., the connecting terminal 178 of FIG. 1) or wirelessly via the wireless communication module (e.g., the wireless communication module 192 of FIG. 1) to output an audio signal.

According to an embodiment, the audio module 170 may generate, without separately including the audio input mixer 220 or the audio output mixer 260, at least one digital audio signal by synthesizing a plurality of digital audio signals using at least one function of the audio signal processor 240.

According to an embodiment, the audio module 170 may include an audio amplifier (not shown) (e.g., a speaker amplifying circuit) that is capable of amplifying an analog audio signal inputted via the audio input interface 210 or an audio signal that is to be outputted via the audio output interface 270. According to an embodiment, the audio amplifier may be configured as a module separate from the audio module 170.

Figure 3:
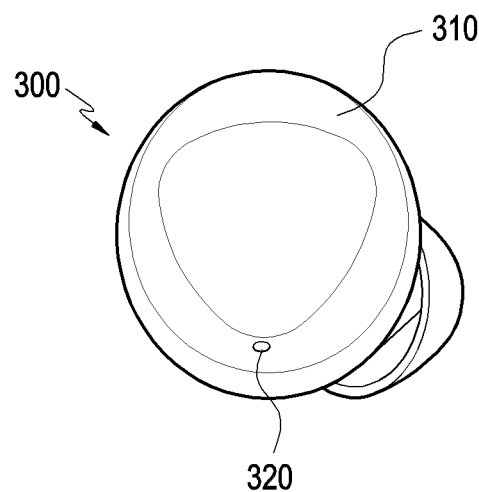
FIG. 3 is a perspective view of an electronic device according to various embodiments of the disclosure.

FIG. 3 is a perspective view of an electronic device according to various embodiments of the disclosure. The components of the electronic device 300 of FIG. 3 may include all or some of the components of the electronic device 101 of FIG. 1 and/or electronic device 200 of FIG. 2.

According to various embodiments, the electronic device 300 may include a housing 310 that is provided with a microphone hole 320. The microphone hole 320 may guide the external sound of the electronic device 300 to an audio module (e.g., the audio module 170 of FIG. 2).

According to various embodiments, the housing 310 may define at least a portion of an outer surface of the electronic device 300. For example, the housing 310 may accommodate the audio module 170 and protect the audio module 170 from an external impact or other external environmental conditions, for example.

According to various embodiments, the electronic device 300 may be fabricated in various shapes. For example, the electronic device 300 of FIG. 3 is illustrated in a shape to be inserted into a user's left ear, but according to an embodiment, an electronic device 300 to be inserted into the user's right ear may be provided. Further, other shapes, sizes, and arrangements of features of the electronic device may be employed without departing from the scope of the present disclosure. For example, the housing 310 shown in FIG. 3 is configured to in-ear wearing, however such configuration is not to be limiting. For example, embodiments of the present disclosure may apply to devices worn over the ear, rather than in the ear.

According to various embodiments, the electronic device 300 may be a wearable electronic device. For example, the electronic device 300 may be at least one of an earphone, an in-ear earphone, an ear set, a headphone, or a headset.

Figure 4:
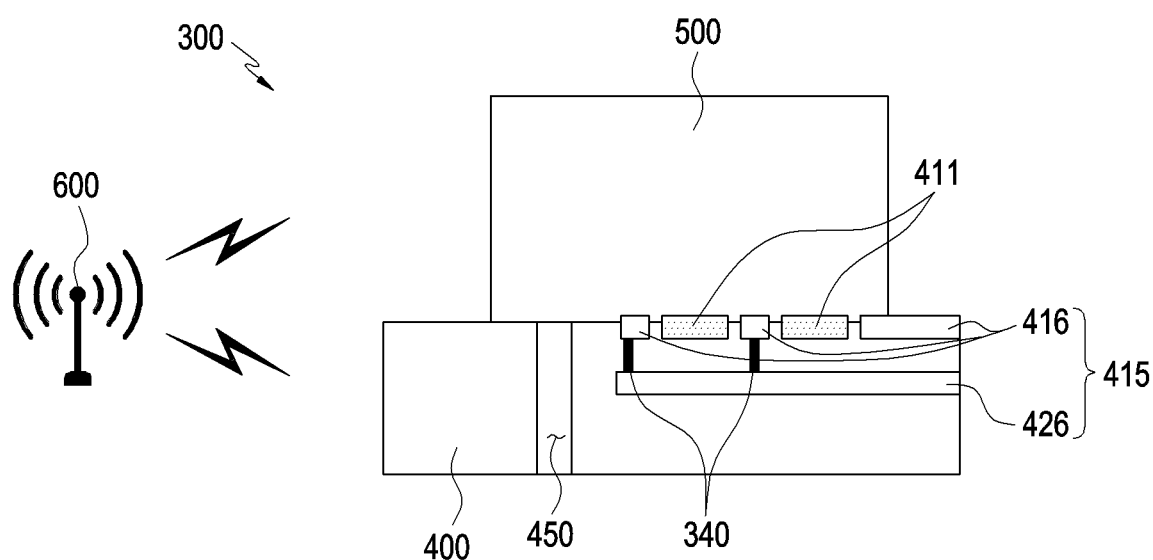
FIG. 4 is a schematic view illustrating a microphone module and a printed circuit board of an electronic device according to various embodiments of the disclosure.
Figure 4:
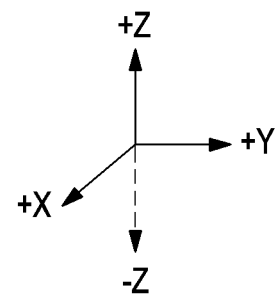

FIG. 4 is a schematic view illustrating a microphone module and a printed circuit board of an electronic device according to various embodiments of the disclosure.

Referring to FIG. 4, the electronic device 300 may include a printed circuit board 400 and a microphone module 500. All or some of the components of the electronic device 300 of FIG. 4 may be the same or similar as those of the electronic devices described above (e.g., electronic device 101 of FIG. 1; electronic device 200 of FIG. 2; electronic device 300 of FIG. 3), and all or some of the components of the microphone module 500 of FIG. 4 may be the same or similar as those of the audio module 170 of FIG. 2.

According to various embodiments, the printed circuit board 400 may be configured to reduce noise generated by the microphone module 500. For example, the printed circuit board 400 may include at least one microphone pad 411 connected to the microphone module 500 and a ground 415 surrounding at least a portion of the microphone pad 411. According to an embodiment, the ground 415 may be configured to block a signal flowing into the microphone pad 411 from an external electronic device 600. For example, the ground 415 may include a first ground 416 disposed in substantially the same plane (XY plane) as the microphone pad 411 and a second ground 426 disposed under or beneath the microphone pad 411 (in the −Z direction). The first ground 416 and the second ground 426 may at least partially surround the microphone pad 411 in a state of being spaced apart from the microphone pad 411 and may block a signal flowing into the microphone pad 411 from the external electronic device 600. In some embodiments, the ground 415 may form a reference potential of the electronic device 300.

Figure 8A:
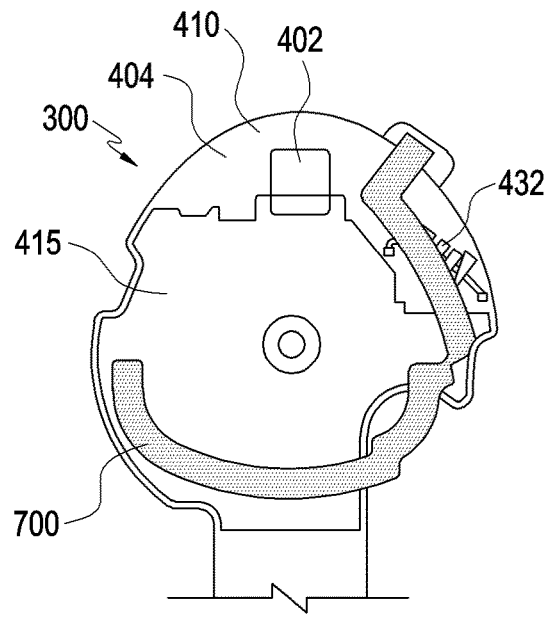
FIGS. 8A and 8B are front views each illustrating an electronic device including an antenna structure and a printed circuit board, according to various embodiments of the disclosure.

According to various embodiments, the printed circuit board 400 may include via holes 340 or other through-holes or apertures to provide electrical connections or the like. The via holes 340 may electrically connect a plurality of layers of the printed circuit board 400. For example, the via holes 340 may electrically connect the first ground 416 and the second ground 426 to each other through the second ground 426. According to an embodiment, the via holes 340 disposed in the ground 415 provided in a first region (e.g., a first region 402 as illustrated in FIG. 8A) in which the microphone module 500 is disposed may electrically connect the first ground 416 and the second ground 426 to each other.

Figure 5A:
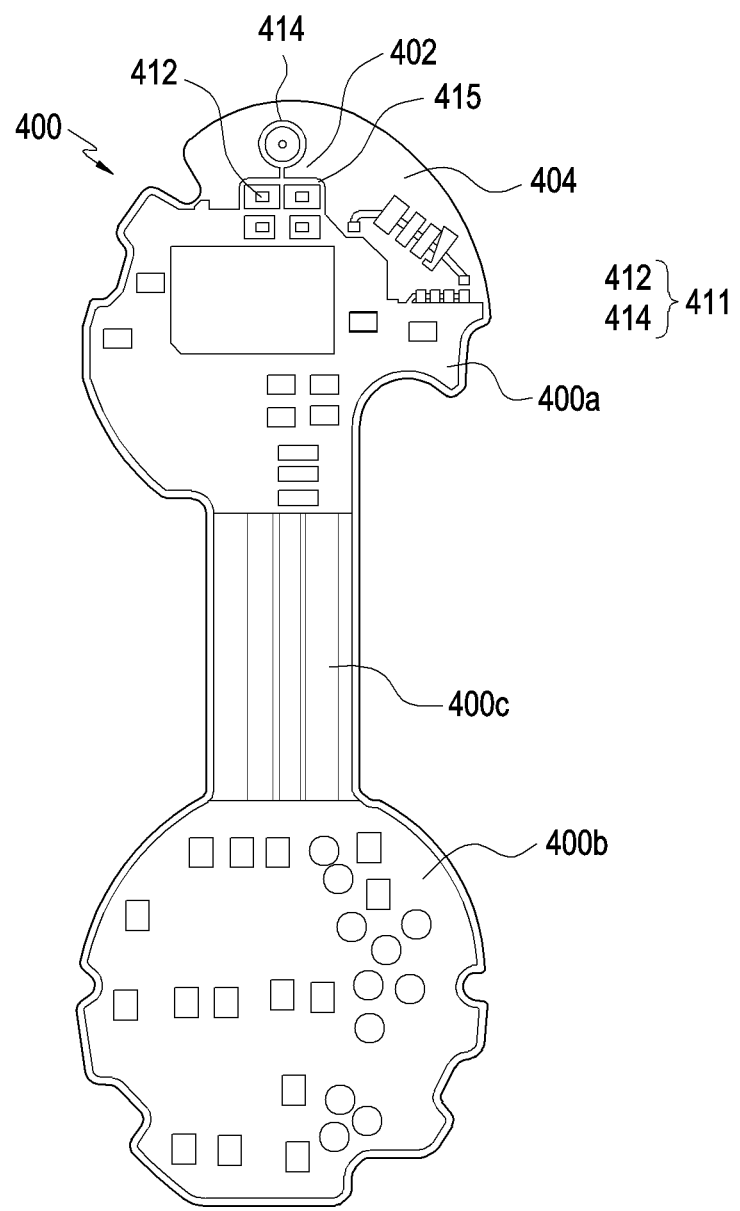
FIGS. 5A and 5B are plan views each illustrating a printed circuit board according to various embodiments of the disclosure.
Figure 5B:
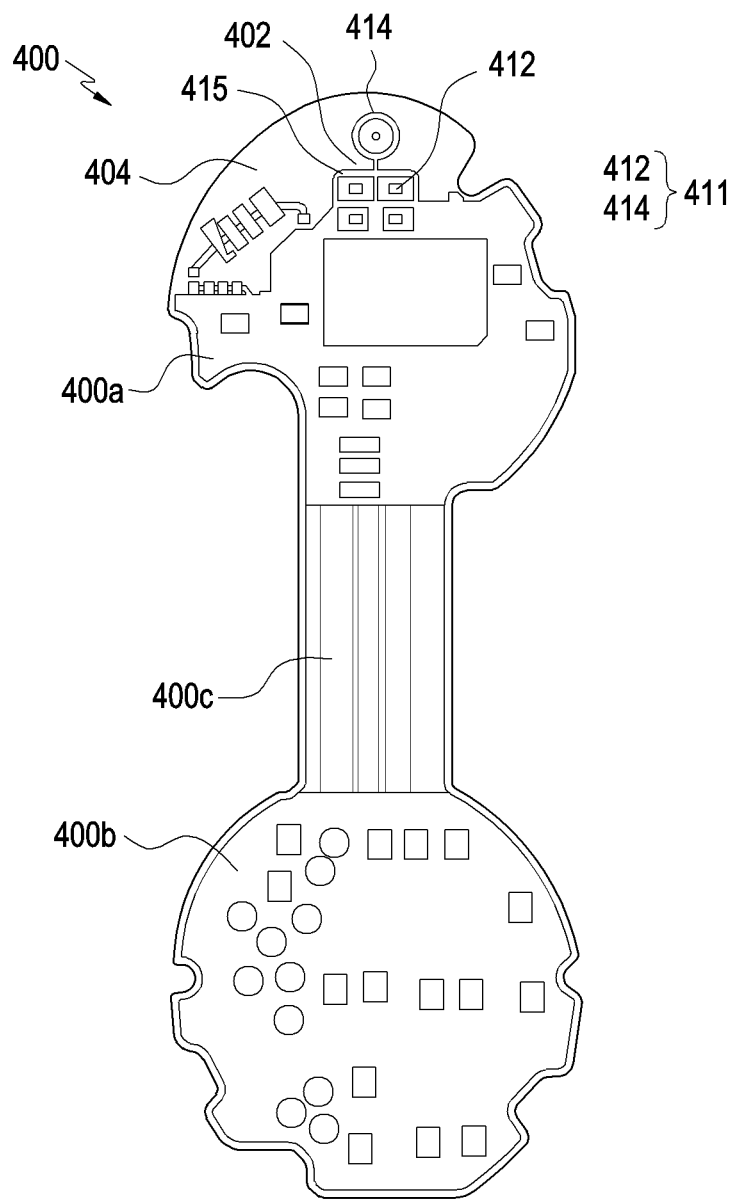
Figure 6A:
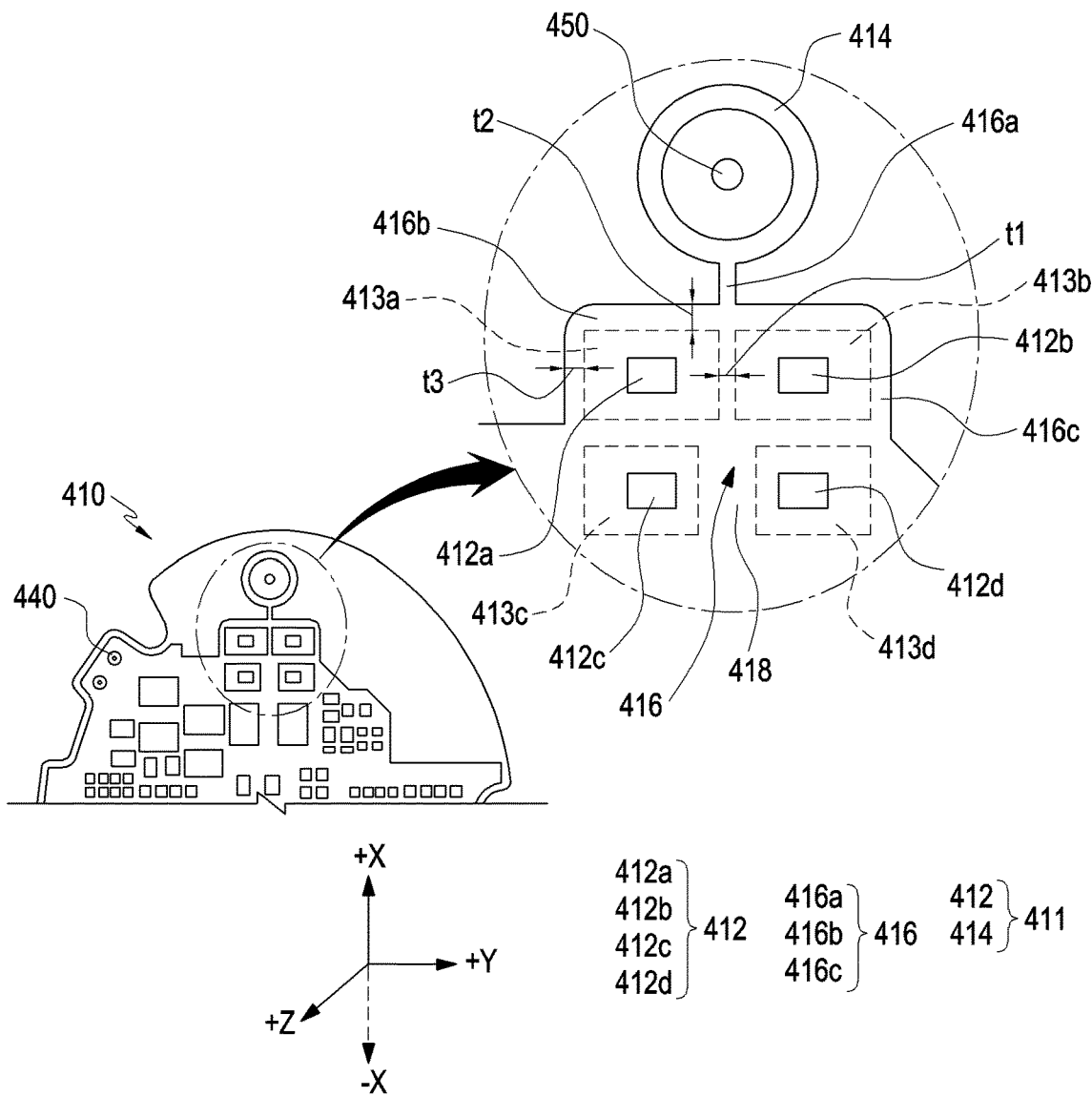
FIGS. 6A and 6B are front views each illustrating one layer of a printed circuit board according to various embodiments of the disclosure.
Figure 6B:
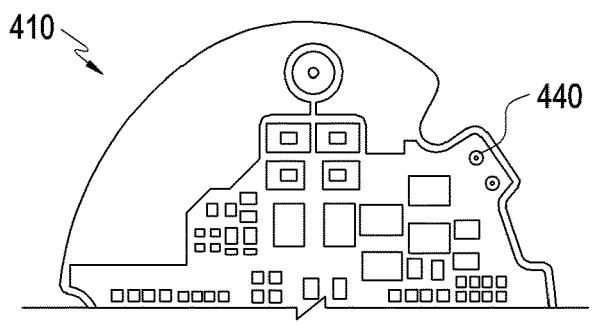
Figure 7A:
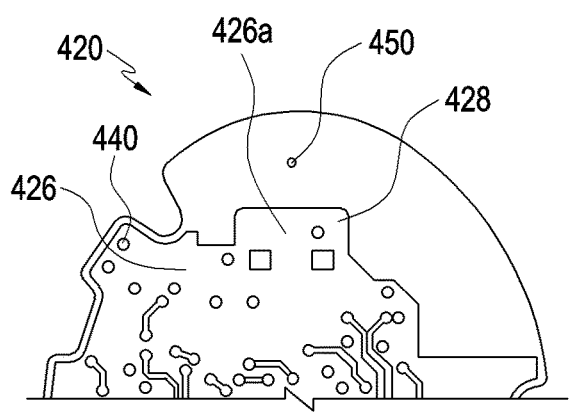
FIGS. 7A and 7B are front views each illustrating a layer of a printed circuit board according to various embodiments of the disclosure.
Figure 7B:
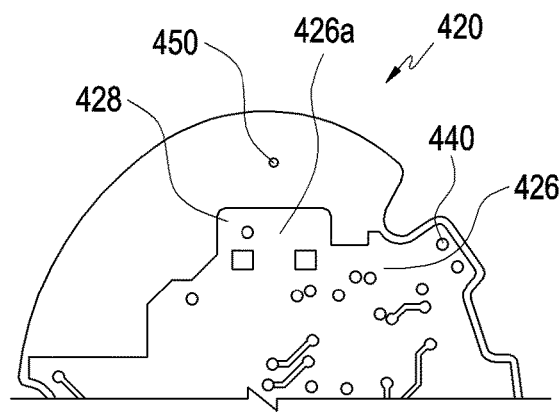
Figure 8B:
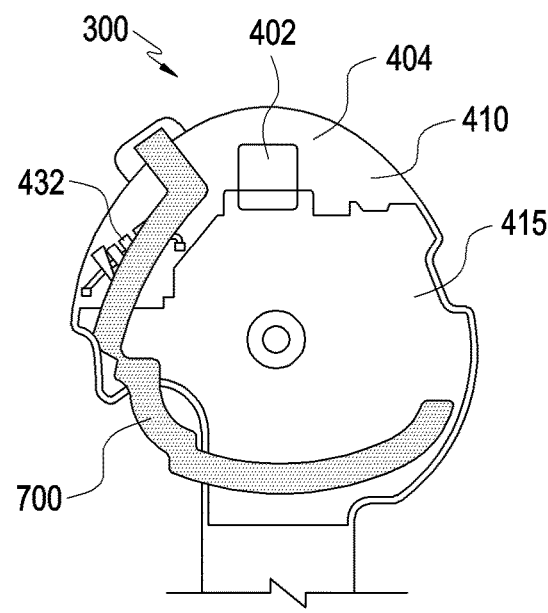

FIGS. 5A and 5B are plan views each illustrating a printed circuit board according to various embodiments of the disclosure. FIGS. 6A and 6B are front views each illustrating one layer of a printed circuit board according to various embodiments of the disclosure. FIGS. 7A and 7B are front views each illustrating another layer of a printed circuit board according to various embodiments of the disclosure. FIGS. 8A and 8B are front views each illustrating still another layer of a printed circuit board according to various embodiments of the disclosure.

According to FIGS. 5A, 5B, 6A, 6B, 7A, 7B, 8A, and 8B, the electronic device 300 may include a printed circuit board 400 including a microphone pad 411 and a ground 415. All or some of the components of the printed circuit board 400 of FIGS. 5A, 5B, 6A, 6B, 7A, 7B, 8A, and 8B are the same or similar as those of the printed circuit board 400 of FIG. 4, and all or some of the components of the electronic device 300 of FIGS. 6A, 6B, 7A, 7B, 8A, and 8B may be the same as those of the electronic device 300 of FIG. 4 or other electronic devices described herein.

According to various embodiments, the printed circuit board 400 may include a plurality of boards. For example, the printed circuit board 400 may include a first board 400a, a second board 400b, and a third board 400c. The third board 400c may be formed or configured as a flexible printed circuit board, and the first board 400a and the second board 400b may be connected to each other via the third board 400c.

According to various embodiments, the first board 400a may include a microphone pad 411 on which a microphone module (e.g., the microphone module 500 of FIG. 4) is disposed, and a ground 415 surrounding at least a portion of the microphone pad 411.

According to various embodiments, the first board 400a may include a first region 402 in which the microphone module is disposed and a second region 404 disposed adjacent to the first region 402. The microphone pad 411 and the ground 415 may be at least partially disposed in the first region 402. For example, the first region 402 may be a portion of the first board 400a on which at least a portion of the first microphone pad 412 is disposed. According to an embodiment, the second region 404 may be a region of the printed circuit board 400 in which the ground 415 is not disposed. According to an embodiment, the second region 404 may be a region of the first board 400a that is located adjacent to the antenna structure (e.g., the antenna structure 700 shown in FIGS. 8A-8B). According to an embodiment, at least a portion of the first region 402 may overlap a portion of the second region 404 disposed adjacent to the antenna structure 700.

According to various embodiments, the printed circuit board 400 may be fabricated in various shapes. For example, when the printed circuit board 400 is mounted in the electronic device 300 to be worn on or in a user's left ear, a second printed circuit board mounted in an electronic device to be worn on the user's right ear may be fabricated with symmetrical structures. According to an embodiment, the printed circuit board 400 of FIG. 5A may have a configuration corresponding to the electronic device 300 to be worn on or in a user's left ear, and the printed circuit board 400 of FIG. 5B may have a configuration corresponding to an electronic device 300 to be worn on or in a user's right ear. That is, as will be appreciated by those of skill in the art, the structures illustrated in FIG. 5A and FIG. 5B are symmetric and illustrative of different printed circuit boards, relative to which ear the device is associated with.

According to various embodiments, the printed circuit board 400 may include a through hole 450 corresponding to a microphone hole (e.g., the microphone hole 320 in FIG. 3). For example, the through hole 450 may be provided through the layers of the printed circuit board 400 (e.g., as shown in FIG. 4). According to an embodiment, the through hole 450 may guide the sound outside the printed circuit board 400 to the microphone module 500.

According to various embodiments, the printed circuit board 400 may include a first layer 410 (e.g., as shown in FIGS. 6A-6B) and a second layer 420 (e.g., as shown in FIGS. 7A-7) disposed under or beneath the first layer 410 (e.g., in the −Z direction).

According to various embodiments, the first layer 410 may be exposed to an outside of the printed circuit board 400. The first layer 410 may include at least one microphone pad 411 and a ground 415 connected to the at least one of the microphone pad 411 (e.g., as shown in FIG. 4).

According to various embodiments, the microphone pad 411 may include a plurality of microphone pads. For example, the microphone pad 411 may include at least one first microphone pad 412 electrically connected to a wire for the operation of the microphone module 500 and a second microphone pad 414 for grounding the microphone module 500.

According to various embodiments, the ground 415 may include a plurality of grounds. For example, the ground 415 may include a first ground 416 disposed on the first layer 410 (e.g., FIGS. 6A-6B) and a second ground 426 disposed on the second layer 420 (e.g., FIGS. 7A-7B).

According to various embodiments, the first microphone pad 412 may include a plurality of pads connected to a plurality of driving wires 413a, 413b, 413c, 413d, respectively. For example, the first microphone pad 412 may include microphone pads 412a-d each connected to one of a microphone bias (e.g., a power source and/or a ground) wire, an L/R selection wire, a microphone data wire, and/or a microphone clock wire. For example, as shown in FIG. 6A, the first microphone pad 412 may include a (1-1)th microphone pad 412a, a (1-2)th microphone pad 412b, a (1-3)th microphone pad 412c, and a (1-4)th microphone pad 412d each of which is connected to one of the microphone bias wire, the L/R selection wire, the microphone data wire, and/or the microphone clock wire. In a non-limiting example embodiment, and as shown in FIG. 6A, the first microphone pad 412 may include a $(1-1)_{th}$ microphone pad 412a connected to a microphone bias wire 413a, a $(1-2)_{th}$ microphone pad 412b connected to an L/R selection wire 413b, a $(1-3)_{th}$ microphone pad 412c connected to a microphone data wire 413c, and a $(1-4)_{th}$ microphone pad 412d connected to a microphone clock line 413d. The first microphone pad 412 may be coupled to the microphone wires of the microphone module 500 via solder or the like. The driving wire may be a wire that electrically connects the microphone module (e.g., the microphone module 500 in FIG. 4) and the printed circuit board 400 to each other for the operation of the processor (e.g., the processor 120 in FIG. 1). For example, the driving wire may include, at least, one of the microphone bias wire 413a, the L/R selection wire 413b, the microphone data wire 413c, and the microphone clock wire 413d.

According to various embodiments, the first microphone pad 412 may be spaced apart from the first ground 416. For example, the first microphone pad 412 may be disposed on substantially the same plane as the first ground 416 while not in direct contact with the first ground 416.

According to various embodiments, the second microphone pad 414 may be connected to a configuration for grounding of the microphone module 500. For example, the second microphone pad 414 may be connected to the first ground 416. The microphone module 500 may obtain a stable potential by using the first ground 416 connected to the second microphone pad 414.

According to various embodiments, the second microphone pad 414 may be provided in various shapes. For example, the second microphone pad 414 may be provided to surround the through hole 450, as illustratively shown in FIG. 6A.

According to various embodiments, the first ground 416 may include a plurality of ground wires. For example, the first ground 416 may include a first ground wire 416a extending from the second microphone pad 414, a plurality of second ground wires 416b extending from the first ground wire 416a, and a third ground wire 416c connected to the second ground wires 416b. The first ground wire 416a, the second ground wires 416b, and the third ground wire 416c may surround at least one first microphone pad 412. The first ground wire 416a, the second ground wires 416b, and the third ground wire 416c surrounding the first microphone pad 414 are configured to reduce radio signals directed to the first microphone pad 414.

According to various embodiments, the first ground 416 may be provided in various shapes. According to an embodiment, the first ground wire 416a may extend from the second microphone pad 414 in a direction toward the first layer 410 (the −X direction). The second ground wires 416b may be provided to extend from the first ground wire 416a in a direction (the +Y direction or the −Y direction) substantially perpendicular to the direction in which the first ground wire 416a is provided (the −X direction). The third ground wire 416c may be connected to the ends of the second ground wires 416b and may be provided in a direction (the −X direction) substantially parallel to the first ground wire 416a.

According to various embodiments, the first ground 416 may have various thicknesses. For example, as shown in FIG. 6A, a thickness t2 of the second ground wires 416b may be smaller than a thickness t1 of the first ground wire 416a. In some non-limiting embodiments, the thickness t2 of the second ground wires 416b and a thickness t3 of the third ground wire 416c may be substantially the same, although in other embodiments, the thickness of these ground wires may be different. According to a non-limiting example embodiment, in order to improve the space efficiency of the printed circuit board 400, the second ground wires 416b may be provided to substantially have a thickness of 0.1 mm, although other thicknesses are possible without departing from the scope of the present disclosure, and may be based on available space on the printed circuit board and/or within the electronic device.

According to various embodiments, the first ground 416 may include a first ground shield 418 extending from the first ground wire 416a. The first ground shield 418 may extend from the first ground wire 416a and may be connected to the second ground 426. According to an embodiment, the first ground shield 418, the second ground wire 416b, and the third ground wire 416c may surround at least a portion of the first microphone pad 412.

According to various embodiments, the printed circuit board 400 may include a via hole 440 that electrically connects the first layer 410 and the second layer 420 to each other (e.g., as shown in FIGS. 6A, 6B, 7A, 7B). According to an embodiment, the via hole 440 may be disposed between the first ground shield 418 and the second ground 426. According to another embodiment, the via hole 440 may be disposed between at least one of the second microphone pad 414 or the first ground 416 and the second ground 426. According to another embodiment, the via hole 440 may be disposed between at least one first microphone pad 412 (e.g., a microphone pad connected to the microphone bias pad) and the second ground 426. The configuration of the via hole 440 may be wholly or partly the same as that of the via hole 340 of FIG. 4.

According to an embodiment, the via hole 440 may stabilize the potential of the electronic device (e.g., the electronic device 300 in FIG. 4) by electrically connecting the first ground 416 and the second ground 426 to each other. According to an embodiment, a plurality of via holes 440 may be provided (e.g., as shown in FIG. 4).

According to various embodiments, the printed circuit board 400 may include a second layer 420 including a second ground 426, as shown in FIGS. 7A-7B.

According to various embodiments, the second ground 426 may be provided in a structure for reducing noise introduced into the first microphone pad 412. For example, the second ground 426 may face at least a portion of the first ground 416 and the first microphone pad 412.

According to various embodiments, the second layer 420 may include a second ground shield 428. The second ground shield 428 may block the introduction of a signal into at least a portion of the first microphone pad 412. According to an embodiment, the second ground shield 428 may extend from an end 426a of the second ground 426 to the second ground wires 416b and the third ground wire 416c. For example, when the printed circuit board 400 is viewed from the top, at least a portion of the second ground shield 428 may overlap at least a portion of the first ground wire 416a, at least a portion of the second ground wires 416b, and at least a portion of the third ground wire 416c.

FIGS. 8A, 8B, 9A, and 9B are front views each illustrating an electronic device 300 including an antenna structure 700 and a printed circuit board, according to various embodiments of the disclosure.

According to FIGS. 8A, 8B, 9A and 9B, some or all the components of the electronic device 300 (or other electronic devices described herein) may be the same or similar as those of the electronic device 300 of FIG. 4, and some or all of the components of the antenna structure 700 may be the same or similar as those of the antenna module 197 of FIG. 1.

According to various embodiments, the electronic device 300 may include the antenna structure 700 in which an antenna pattern is provided. The electronic device 300 may communicate with an external electronic device (e.g., the electronic device 102 in FIG. 1) by using the antenna structure 700.

According to various embodiments, the antenna structure 700 may be fabricated in various ways. According to a non-limiting embodiment, the antenna structure 700 may be a laser direct structuring (LDS) antenna. For example, the antenna structure 700 may include a resin (e.g., polycarbonate) on which an antenna pattern is provided and a metal (e.g., copper and/or nickel) plated on the antenna pattern, and the antenna pattern can be formed by a laser. According to some embodiments, the antenna structure 700 may be an antenna provided in a housing. According to some embodiments, the antenna structure 700 may be formed of a separate antenna flexible printed circuit board, and may be electrically connected to the printed circuit board 400. According to some embodiments, the antenna structure 700 may be an antenna printed on the printed circuit board 400.

According to various embodiments, the electronic device 300 may be configured in a structure that reduces noise of the microphone module 500 due to the antenna structure 700. For example, as the antenna structure 700 is closer to the microphone module 500, radio signals introduced into the microphone module 500 may increase, and thus noise generated from the microphone module 500 may increase. According to an embodiment, a ground (e.g., the ground 415 in FIG. 4) may prevent a signal generated from the antenna structure 700 from flowing into the microphone module 500.

According to FIGS. 8A and 8B, the antenna structure 700 may be disposed adjacent to a microphone module (e.g., the microphone module 500 of FIG. 4). When the printed circuit board is viewed from the top, at least a portion of the antenna structure 700 overlaps at least a portion of the second region 404 of the first board 410 in which the microphone module 500 is disposed. The second region 404 may be a region of the printed circuit board 400 adjacent to the first region 402 in which the microphone module 500 is disposed. Because the antenna structure 700 is disposed adjacent to the microphone module 500, the volume of the electronic device 300 may be reduced. According to an embodiment, a connection portion of the antenna structure 700 to be connected to the printed circuit board may be disposed adjacent to the printed circuit board. The connection portion of the antenna structure 700 may be disposed adjacent to the second region 404. The second region 404 may be a region of the printed circuit board in which a ground pattern (e.g., the ground 415 in FIG. 4) is not provided. According to an embodiment, at least a portion of the first region 402 in which the microphone module 500 is disposed may be provided in the second region 404. For example, the first region 402 may be disposed adjacent to the antenna structure 700.

Figure 9A:
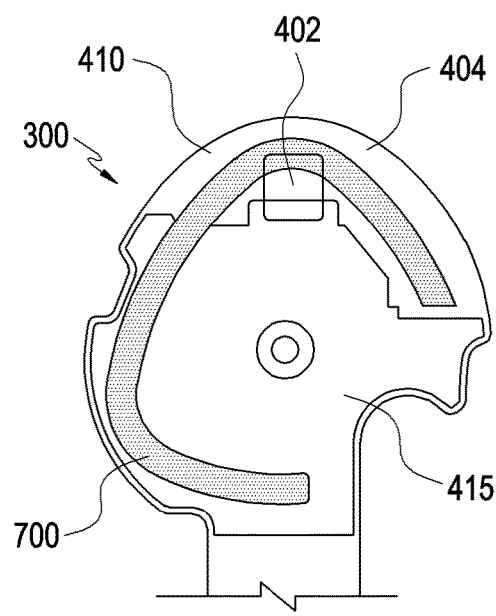
FIGS. 9A and 9B are front views each illustrating an electronic device including an antenna structure and a printed circuit board, according to various embodiments of the disclosure.
Figure 9B:
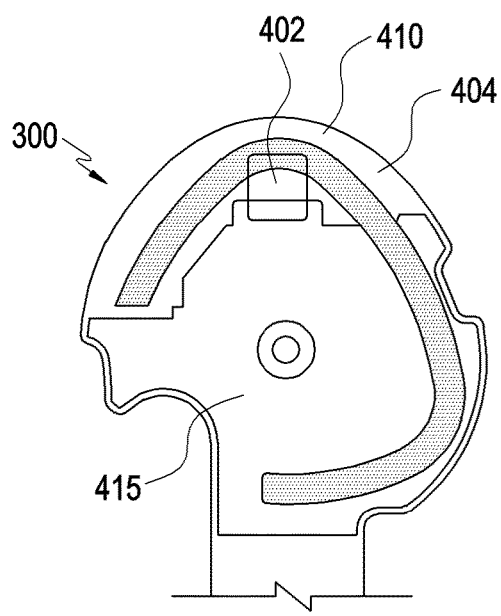

According to FIGS. 9A and 9B, when the printed circuit board is viewed from the top, at least a portion of the antenna structure 700 may overlap at least a portion of the first region 402 of the first board 410 in which the microphone module 500 is disposed. For example, when the electronic device 300 is viewed from the top, the antenna structure 700 may overlap the first region 402 and the second region 404. Because the antenna structure 700 overlaps a portion of the printed circuit board, the volume of the electronic device 300 may be reduced.

Figure 10A:
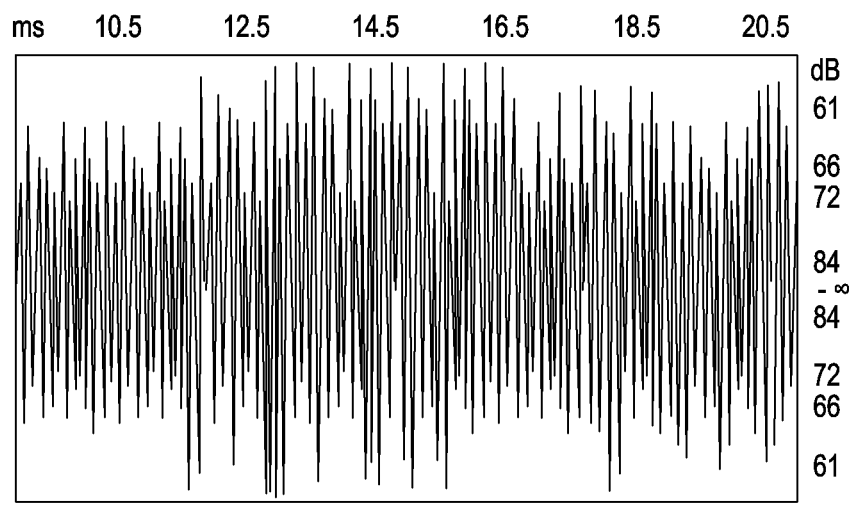
FIGS. 10A and 10B are diagrams illustrating recording waveforms of an electronic device according to various embodiments of the disclosure.
Figure 10B:
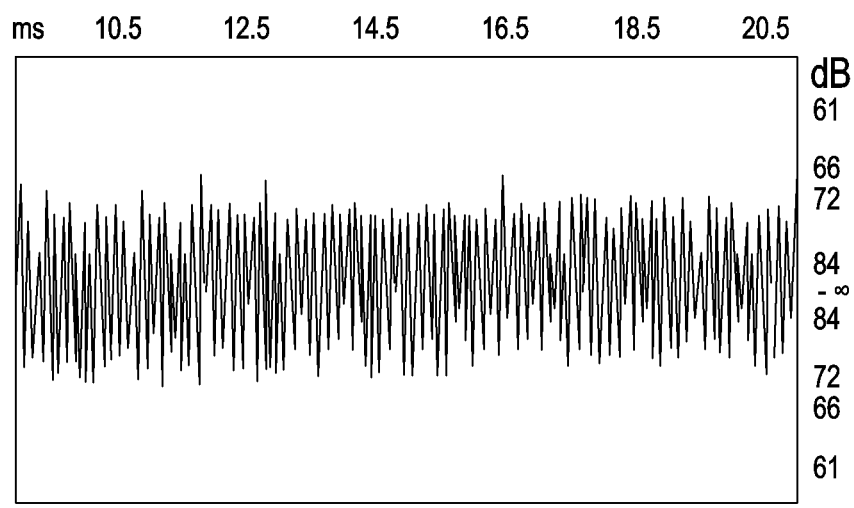
Figure 11:
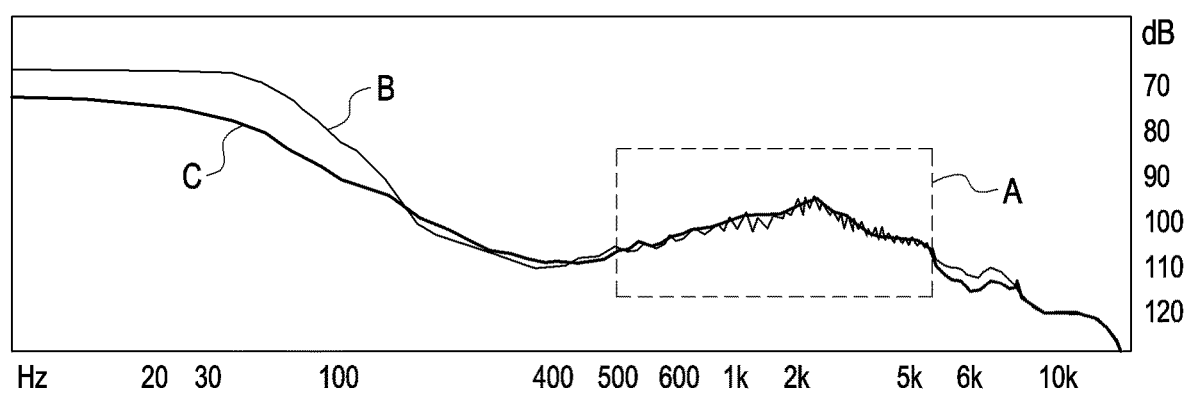
FIG. 11 is a diagram illustrating a frequency response of an electronic device according to various embodiments of the disclosure.

FIGS. 10A and 10B are diagrams illustrating recording waveforms of an electronic device according to various embodiments of the disclosure. FIG. 11 is a diagram illustrating a frequency response of an electronic device according to various embodiments of the disclosure.

According to FIGS. 10A and 10B, the recording waveforms of the electronic device (e.g., the electronic device 300 of FIG. 4) may be changed based on the structure of a ground (e.g., the ground 415 in FIG. 4). For example, FIG.

10A shows a recording wave form (a first recording waveform) of an electronic device 300 that does not include the second ground wires (e.g., the second ground wires 416b in FIG. 6A), the third ground wire (e.g., the third ground wire 416c in FIG. 6A), and the second ground shield (the second ground shield 428 in FIG. 7A). FIG. 10B is a recording waveform (a second recording waveform) of an electronic device 300 that includes the second ground wires (e.g., the second ground wires 416b in FIG. 6A), the third ground wire (e.g., the third ground wire 416c in FIG. 6A), and the second ground shield (the second ground shield 428 in FIG. 7A). As shown, the noise of the second recording waveform may be smaller than the noise of the first recording waveform (e.g., less variation in amplitude). That is, as shown, for substantially the same time period, decibels (dB) of the second recording waveform may be formed to have a deviation (e.g., maximum amplitude) less than that of decibels of the first recording waveform.

Referring to FIG. 11, the frequency response of the electronic device (e.g., the electronic device 300 in FIG. 4) may be changed based on the structure of the ground (e.g., the ground 415 in FIG. 4). For example, a second frequency response signal C of an electronic device 300 that includes the second ground wires (e.g., the second ground wires 416b in FIG. 6A), the third ground wire (e.g., the third ground wire 416c in FIG. 6A), and the second ground shield (the second ground shield 428 in FIG. 7A) may be different from a first frequency response signal B of an electronic device 300 that does not include these elements. For example, the noise of the second frequency response signal C may be smaller than the noise of the first frequency response signal B. According to an embodiment, in a first frequency region A, shown in FIG. 11, the second frequency response signal C may be formed to be more stable than the first frequency response signal B (e.g., less variability in signal in first frequency region A). The first frequency region A may be a region of a predetermined frequency range. For example, the first frequency region A may have a frequency range of higher than 500 Hz and lower than 6000 Hz.

An electronic device (e.g., the electronic device 101 in FIG. 1) according to various embodiments of the disclosure may include a microphone module (e.g., the microphone module 500 in FIG. 4) and a printed circuit board (e.g., the printed circuit board 400 in FIG. 5A) on which the microphone module is disposed, wherein the printed circuit board may include a first layer (e.g., the first layer 410 in FIG. 6A) including at least one first microphone pad (e.g., the first microphone pad 412 in FIG. 6A) coupled to the microphone module, a first ground (e.g., the first ground 416 of FIG. 6A) spaced apart from the first microphone pad, and a second microphone pad (e.g., the second microphone pad 414 in FIG. 6A) coupled to the microphone module and connected to the first ground, and a second layer (e.g., the second layer 420 of FIG. 7A) disposed under the first layer and including a second ground (e.g., the second ground 426 of FIG. 7A) that faces a least a portion of the first ground and the first microphone pad.

According to various embodiments, the first ground may include a first ground wire (e.g., the first ground wire 416a of FIG. 6A) extending from the second microphone pad, a plurality of second ground wires (e.g., the second ground wires 416b in FIG. 6A) extending from the first ground wire, and a third ground wire (e.g., the third ground wiring 416c of FIG. 6A) connected to the second ground wires, and the first ground wire, the second ground wires, and the third ground wire may surround the at least one first microphone pad.

According to various embodiments, the second ground may include a second ground shield (e.g., the second ground shield 428 in FIG. 7A) extending from an end (e.g., the end 426a in FIG. 7A) of the second ground to the second ground wires and the third ground wire.

According to various embodiments, at least a portion of the first ground and the second ground shield may surround the first microphone pad.

According to various embodiments, the electronic device may further include a via hole (e.g., the via hole 440 in FIG. 6A) electrically connected to the first ground and the second ground, wherein the first ground may include a first ground shield (e.g., the first ground shield 418 in FIG. 6A) connected to the first ground wire and the via hole.

According to various embodiments, the electronic device may further include a processor configured to control the operation of the microphone module (e.g., the processor 120 in FIG. 1), wherein the first microphone pad may be connected to a driving wire for the operation of the processor.

According to various embodiments, the electronic device may further include an antenna structure (e.g., the antenna structure 700 in FIGS. 8A, 9A), wherein the printed circuit board may include a layer on which an antenna connection portion (e.g., an antenna connection portion 432 in FIG. 8A) for connection with the antenna structure is disposed.

According to various embodiments, the printed circuit board may include a first region (e.g., the first region 402 in FIG. 5A) in which the microphone module is disposed and a second region (e.g., the second region 404 of FIG. 5A) disposed adjacent to the first region, wherein at least a portion of the antenna structure may overlap at least a portion of the second region of the microphone module.

According to various embodiments, at least a portion of the antenna structure may further overlap at least a portion of the first region of the microphone module.

According to various embodiments, the printed circuit board may include at least one layer on which electronic components of the electronic device are disposed.

According to various embodiments, the electronic device may further include a housing including a microphone hole for transmitting external sound of the electronic device to the microphone module.

According to various embodiments, the printed circuit board may include a through hole (e.g., the through hole 450 in FIG. 6A) corresponding to the microphone hole.

According to various embodiments, the second microphone pad may be provided to surround the through hole.

According to various embodiments, the electronic device is a wireless earphone.

According to various embodiments, the thickness of the second ground wire may be smaller than the thickness of the first ground wire.

According to various embodiments, the printed circuit board may include a first board (e.g., the first board 400a of FIG. 5A) to which the microphone module is connected, a flexible third board (e.g., the third board 400c in FIG. 5A) extending from the first board, and a second board (e.g., the second board 400b of FIG. 5A) connected to the third board and facing the third board.

According to various embodiments of the disclosure, the electronic device (e.g., the electronic device 101 in FIG. 1) may include a microphone module (e.g., the microphone module 500 in FIG. 4) and a printed circuit board on which the microphone module is disposed, wherein the printed circuit board may include a ground (e.g., the ground 415 in FIG. 4) and at least one first microphone pad (e.g., the first microphone pad 412 in FIG. 6A) spaced apart from the ground, and a second microphone pad (e.g., the second microphone pad 414 in FIG. 6A) connected to the ground, and the ground may surround at least a portion of the first microphone pad.

According to various embodiments, the ground may include a first ground (e.g., the first ground 416 in FIG. 6A) spaced apart from the first microphone pad and a second ground connected to the second microphone pad (e.g., the second ground 426 in FIG. 7A), the second ground may be disposed under the first ground.

According to various embodiments, the printed circuit board may include a first layer (e.g., the first layer 410 in FIG. 6A) including the first microphone pad, the second microphone pad, and the first ground, and a second layer (e.g., the second layer 420 of FIG. 7A) including the second ground and disposed under the first layer.

The printed circuit board (e.g., the printed circuit board 400 in FIG. 5A) according to various embodiments of the disclosure may include a first layer (e.g., first layer 410 in FIG. 6A) including at least one first microphone pad (e.g., the first microphone pad 412 in FIG. 6A), a first ground spaced apart from the first microphone pad (e.g., the first ground 416 in FIG. 6A), and a second microphone pad connected to the first ground (e.g., the second microphone pad 414 in FIG. 6A), and a second layer (e.g., the second layer 420 in FIG. 7A) disposed under the first layer and including a second ground (e.g., the second ground 426 in FIG. 7A) facing at least a portion of the first ground and the first microphone pad.

It may be apparent to a person ordinarily skilled in the technical field to which the disclosure belongs that the above-described electronic device including various printed circuit board according to the disclosure described above is not limited by the above-described embodiments and drawings, and can be variously substituted, modified, and changed within the technical scope of the disclosure.

What is claimed is:

1. An electronic device comprising:
    an antenna structure;
    a microphone module spaced apart from the antenna structure; and
    a printed circuit board on which the microphone module is disposed,
    wherein the printed circuit board includes:
    a first layer including a first microphone pad coupled to the microphone module, a first ground surrounding the first microphone pad, and a second microphone pad coupled to the microphone module and connected to the first ground; and
    a second layer disposed under the first layer and including a second ground facing at least a portion of the first ground and the at least one first microphone pad,
    wherein the first ground comprises:
    a ground shield spaced apart from the first microphone pad;
    a first ground wire connecting the ground shield and the second microphone pad; and
    a second ground wire extending around the first microphone pad and connecting the first ground wire and the ground shield,
    wherein the ground shield, the first ground wire, and the second ground wire surround the first microphone pad.

2. The electronic device of claim 1, wherein the first microphone pad comprises a (1-1)th microphone pad surrounded by the ground shield, the first ground wire, and the second ground wire, and a (1-2)th microphone pad,
    wherein the first layer comprises a third ground wire extending around the (1-2)th microphone pad and connecting the first ground wire and the ground shield, and
    wherein the ground shield, the first ground wire, and the third ground wire surround the (1-2)th microphone pad.

3. The electronic device of claim 2, wherein the second ground includes a second ground shield extending from an end of the second ground to the second ground wire and the third ground wire.

4. The electronic device of claim 3, wherein at least a portion of the first ground and the second ground shield surround the first microphone pad.

5. The electronic device of claim 2, further comprising:
    a via hole electrically connected to the ground shield of the first ground and the second ground.

6. The electronic device of claim 1, further comprising:
    a processor configured to control an operation of the microphone module,
    wherein the first microphone pad is connected to a driving wire configured to operate the processor.

7. The electronic device of claim 1,
    wherein the antenna structure comprises an antenna pattern,
    wherein the printed circuit board includes a first region in which the microphone module is disposed and a second region which is disposed adjacent to the first region, and wherein at least a portion of the antenna structure overlaps at least a portion of the second region.

8. The electronic device of claim 7, wherein at least a portion of the antenna structure overlaps at least a portion of the first region.

9. The electronic device of claim 1, further comprising:
    a housing including a microphone hole configured to direct external sound of the electronic device to the microphone module,
    wherein the printed circuit board includes a through hole corresponding to the microphone hole.

10. The electronic device of claim 9, wherein the second microphone pad surrounds the through hole.

11. The electronic device of claim 1, wherein the electronic device is a wireless communication ear set.

12. The electronic device of claim 1, wherein a thickness of the second ground wire is smaller than a thickness of the first ground wire.

* * * * *